(12) United States Patent
Hatakeyama et al.

(10) Patent No.: US 7,416,833 B2
(45) Date of Patent: Aug. 26, 2008

(54) PHOTORESIST UNDERCOAT-FORMING MATERIAL AND PATTERNING PROCESS

(75) Inventors: Jun Hatakeyama, Joetsu (JP); Takanobu Takeda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 385 days.

(21) Appl. No.: 11/180,703

(22) Filed: Jul. 14, 2005

(65) Prior Publication Data

US 2006/0014106 A1    Jan. 19, 2006

(30) Foreign Application Priority Data

Jul. 15, 2004    (JP)    ............. 2004-208385

(51) Int. Cl.
*G03F 7/00*    (2006.01)

(52) U.S. Cl. .............. 430/270.1; 430/311; 430/313; 430/317; 524/548; 524/549; 526/267

(58) Field of Classification Search ............. 430/270.1, 430/273.1, 311, 313, 317; 524/548, 549; 526/267
See application file for complete search history.

(56) References Cited

U.S. PATENT DOCUMENTS

| | | | |
|---|---|---|---|
| 2,437,278 A * | 3/1948 | Soday ............. 526/225 |
| 5,886,119 A | 3/1999 | Schaedeli et al. |
| 5,972,560 A | 10/1999 | Kaneko et al. |
| 6,028,154 A | 2/2000 | Schaedeli et al. |
| 6,042,989 A | 3/2000 | Schaedeli et al. |
| 6,309,796 B1 | 10/2001 | Nakashima et al. |
| 6,420,088 B1 | 7/2002 | Angelopoulos et al. |
| 6,506,497 B1 | 1/2003 | Kennedy et al. |
| 6,617,086 B2 * | 9/2003 | Angelopoulos et al. ....... 430/17 |
| 6,623,909 B2 | 9/2003 | Hatakeyama et al. |
| 6,730,453 B2 | 5/2004 | Nakashima et al. |
| 6,852,791 B2 | 2/2005 | Kawaguchi et al. |
| 7,214,743 B2 * | 5/2007 | Hatakeyama et al. ....... 525/534 |
| 2004/0241577 A1 * | 12/2004 | Hatakeyama et al. .... 430/270.1 |

FOREIGN PATENT DOCUMENTS

| | | | |
|---|---|---|---|
| JP | 56084730 A | * | 7/1981 |
| JP | 56084731 A | * | 7/1981 |
| JP | 6-118651 A | | 4/1994 |
| JP | 9-110938 A | | 4/1997 |

(Continued)

OTHER PUBLICATIONS

Brunsvold et al., SPIE vol. 1925 (1993), pp. 377-387.

(Continued)

*Primary Examiner*—Amanda C. Walke
(74) *Attorney, Agent, or Firm*—Birch, Stewart, Kolasch & Birch, LLP

(57) ABSTRACT

An undercoat-forming material comprising a copolymer derived from an indene and a compound having a hydroxyl or epoxy group and a double bond, an organic solvent, an acid generator, and a crosslinker, optionally combined with an intermediate layer having an antireflective effect, has an absorptivity coefficient sufficient to provide an antireflective effect at a thickness of at least 200 nm and a high etching resistance as demonstrated by slow etching rates with $CF_4$/$CHF_3$ and $Cl_2$/$BCl_3$ gases for substrate processing.

19 Claims, 6 Drawing Sheets

FOREIGN PATENT DOCUMENTS

| | | |
|---|---|---|
| JP | 10-324748 A | 12/1998 |
| JP | 11-302382 A | 11/1999 |
| JP | 2001-040293 A | 2/2001 |
| JP | 2001151861 A * | 6/2001 |
| JP | 2002-014474 A | 1/2002 |
| JP | 2002-055456 A | 2/2002 |
| JP | 2002-214777 A | 7/2002 |
| JP | 2003020316 A * | 1/2003 |
| JP | 2004107377 A * | 4/2004 |
| JP | 2004107385 A * | 4/2004 |
| JP | 2005008769 A * | 1/2005 |

OTHER PUBLICATIONS

Hatakeyama et al., SPIE vol. 3333 (1998) pp. 62-72.
Schaedeli et al., Journal of Photopolymer Science and Technology, vol. 9, No. 3 (1996), pp. 435-446.
Kunz et al., J. Vac. Sci. Technol. B 17(6), Nov./Dec. 1999, pp. 3267-3272.
Kwong et al., SPIE vol. 4345 (2001), pp. 50-57.

* cited by examiner

SUBSTRATE REFLECTANCE
INTERMEDIATE LAYER n=1.5, VARYING k

□ 0-1   ▨ 1-2   ▨ 2-3   ▨ 3-4   ■ 4-5   SUBSTRATE REFLECTANCE (%)

SUBSTRATE REFLECTANCE
INTERMEDIATE LAYER n=1.5, k=0.1
UNDERCOAT LAYER n=1.5, k=0.2

□ 0-1   ▨ 1-2   ▨ 2-3   ▨ 3-4   ■ 4-5   SUBSTRATE REFLECTANCE (%)

SUBSTRATE REFLECTANCE
INTERMEDIATE LAYER n=1.5, k=0.1
UNDERCOAT LAYER n=1.5, k=0.6

PHOTORESIST UNDERCOAT-FORMING MATERIAL AND PATTERNING PROCESS

CROSS-REFERENCE TO RELATED APPLICATION

This non-provisional application claims priority under 35 U.S.C. §119(a) on Patent Application No. 2004-208385 filed in Japan on Jul. 15, 2004, the entire contents of which are hereby incorporated by reference.

This invention relates to an undercoat-forming material useful in a multilayer resist technology for micropatterning in a process for the fabrication of semiconductor devices or the like, and a resist pattern-forming process adapted for exposure to KrF excimer laser (248 nm), ArF excimer laser (193 nm), $F_2$ laser (157 nm), $Kr_2$ laser (146 nm), $Ar_2$ laser (126 nm) beams, soft X-rays, electron beams, ion beams and X-rays, using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 µm or less), a shorter wavelength light source is required. In particular, photolithography using ArF excimer laser light (193 nm) is now under investigation.

On the other hand, it is known in the art that the bilayer resist process is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). For ArF laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p. 62). For $F_2$ laser exposure, positive resist compositions based on a silsesquioxane having hexafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper layer of silicon-containing resist and to minimize the sidewall corrugation and pattern collapse by standing waves, the undercoat layer must also have the function of an antireflective coating. Specifically, the reflectance from the undercoat layer back into the resist film must be reduced to below 1%.

Now, the results of calculation of reflectance at film thickness varying up to the maximum of 500 nm are shown in FIGS. 1 and 2. Assume that the exposure wavelength is 193 nm, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm or greater, optimum values at which the reflectance is reduced to or below 1% exist in the refractive index range of 1.6 to 1.9 which is approximate to or slightly higher than that of the topcoat resist.

FIG. 2 shows substrate reflectance when the undercoat layer has a fixed n value of 1.5 and the k value varies from 0.1 to 0.8. In the k value range of 0.24 to 0.15, the reflectance can be reduced to or below 1%. By contrast, the antireflective film used in the form of a thin film of about 40 nm thick in the monolayer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylates are under study as described in SPIE vol. 4345, p. 50 (2001). Polyhydroxystyrene has a very strong absorption at 193 nm and its k value is as high as around 0.6 by itself. By copolymerizing with an acrylate having a k value of almost 0, the k value of the copolymer is adjusted to around 0.25.

However, the resistance of the acrylate to substrate etching is weak as compared with polyhydroxystyrene, and a considerable proportion of the acrylate must be copolymerized in order to reduce the k value. As a result, the resistance to substrate etching is considerably reduced. The etching resistance is not only reflected by the etching speed, but also evidenced by the development of surface roughness after etching. Through copolymerization of acrylic compound, the surface roughness after etching is increased to a level of serious concern.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin when the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free monolayer resist as a topcoat, an intermediate layer containing silicon below the resist, and an organic undercoat below the intermediate layer. See J. Vac. Sci. Technol., 16(6), November/December 1979. Since the monolayer resist generally provides better resolution than the silicon-containing resist, the tri-layer process permits such a high resolution monolayer resist to be used as an imaging layer for light exposure. A spin-on-glass (SOG) coating is used as the intermediate layer. A number of SOG coatings have been proposed.

In the tri-layer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. No. 6,506,497 and U.S. Pat. No. 6,420,088 disclose silicon-containing layer materials endowed with antireflective effect. In general, a multi-layer antireflective coating has greater antireflective effect than a monolayer antireflective coating and commercially widely used as an antireflective film for optical articles. A higher antireflective effect is obtainable by imparting an antireflective effect to both an intermediate layer and an undercoat layer. If the silicon-containing intermediate layer in the tri-layer process is endowed with the function of an antireflective coating, the undercoat layer need not necessarily possess the maximum function of an antireflective coating. In the tri-layer process, the undercoat layer is required to have high etching resistance during substrate processing rather than the antireflective coating effect. Then a novolac resin having high etching resistance and containing more aromatic groups must be used as the undercoat layer in the tri-layer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the antireflective coating must have a k value of 0.2 or greater in order to reduce reflectance to 1% at a coating thickness of 100 nm or less (see FIG. 2). In the tri-layer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolac and polyhydroxystyrene. The thickness of the undercoat layer varies with the topography of the substrate whereas the thickness of the intermediate layer is kept substantially unchanged so that presumably it can be coated to the predetermined thickness. The undercoat layer with a higher k value (0.6) is effective in reducing reflectance to 1% or less with a thinner film. In the event where the undercoat layer has a k value of 0.2 and a thickness of 250 nm, in order to provide a reflectance of 1% or less, the intermediate layer must be increased in thickness. Increasing the thickness of the intermediate layer is not preferable because a greater load is applied to the topcoat of resist during dry etching of the intermediate layer. To use the undercoat layer in thin film form, it must have not only a high k value, but also greater etching resistance.

SUMMARY OF THE INVENTION

An object of the present invention is to provide a photoresist undercoat-forming material which is useful as an undercoat layer in the bi- or tri-layer resist technology and has greater etching resistance than polyhydroxystyrene and cresol novolac resin, and a pattern-forming process using the same.

The inventors have discovered that a copolymer derived from an indene and a compound having a hydroxyl or epoxy group and a polymerizable double bond and typically from an indene and hydroxystyrene is a promising material to form an undercoat layer for the bi- or tri-layer resist technology and has improved etching resistance.

More particularly, the invention relates to a material for forming an undercoat layer in the bi- or tri-layer resist technology, comprising a copolymer derived from an indene and a compound having a hydroxyl or epoxy group and a polymerizable double bond and typically from an indene and hydroxystyrene as a base resin, which material has improved etching resistance and is adapted for exposure to high-energy radiation of less than 300 nm wavelength, specifically lasers at 248, 193 and 157 nm, soft x-rays of 3 to 20 nm, electron beams and x-rays. The material is fully resistant to dry etching during substrate processing.

The undercoat layer of the invention is primarily applicable to the tri-layer process. The undercoat layer provides substantial substrate reflection when used in the bilayer process using KrF or ArF, due to a high k value for that use, but when combined with an intermediate layer having an antireflective effect, can reduce the substrate reflectance to 1% or less.

Accordingly, the present invention provides an undercoat-forming material and a pattern-forming process as defined below.

In one aspect, the invention provides an undercoat-forming material comprising a polymer obtained by copolymerizing an indene with a compound having a hydroxyl or epoxy group and a polymerizable double bond.

One preferred embodiment is an undercoat-forming material comprising a polymer obtained by copolymerizing an indene with hydroxystyrene or glycidyl ether styrene.

In a preferred embodiment, recurring units derived from the indene have the general formula (a):

wherein $R^1$ is independently selected from the group consisting of hydrogen, straight, branched or cyclic $C_1$-$C_{10}$ alkyl groups, $C_6$-$C_{10}$ aryl groups, allyl groups, and halogen atoms, p is an integer of 1 to 4, and X is methylene, —O—, —S— or —NH—.

The undercoat-forming material may further comprise an organic solvent, an acid generator, and preferably a crosslinker.

In another aspect, the invention provides a patterning process comprising the steps of applying the undercoat-forming material defined above onto a processable substrate to form an undercoat layer; applying a photoresist composition onto the undercoat layer to form a photoresist layer; exposing the photoresist layer in a predetermined region to radiation; developing the photoresist layer with a developer to form a photoresist pattern; and processing the undercoat layer and the substrate through the patterned photoresist layer as a mask, by means of a dry etching apparatus.

Preferably, the photoresist composition comprises a hydrocarbon compound. Also preferably, the photoresist composition comprises a silicon atom-containing polymer, and the processing step includes dry etching the undercoat layer through the photoresist layer as a mask with an oxygen-based etching gas.

In a further aspect, the invention provides a patterning process comprising the steps of applying the undercoat-forming material defined above onto a processable substrate to form an undercoat layer; applying a silicon atom-containing intermediate layer over the undercoat layer; applying a photoresist composition onto the intermediate layer to form a photoresist layer; exposing the photoresist layer in a predetermined region to radiation; developing the photoresist layer with a developer to form a photoresist pattern; processing the intermediate layer through the patterned photoresist layer as a mask; removing the patterned photoresist layer; and processing the undercoat layer and then the substrate through the processed intermediate layer as a mask, the processing steps using a dry etching apparatus.

Preferably, the photoresist composition comprises a silicon atom-free polymer, and the step of processing the undercoat layer includes dry etching with an oxygen-based etching gas.

The undercoat-forming material of the invention, optionally combined with an intermediate layer having an antireflective effect, has an absorptivity coefficient sufficient to provide an antireflective effect at a thickness equal to or more than 200 nm and a high etching resistance as demonstrated by an etching rate with $CF_4/CHF_3$ gas and $Cl_2/BCl_3$ gas (used in substrate processing) which is slower than conventional m-cresol novolac resins. The resist profile after patterning is satisfactory.

DESCRIPTION OF THE PREFERRED EMBODIMENTS

Figure 1:
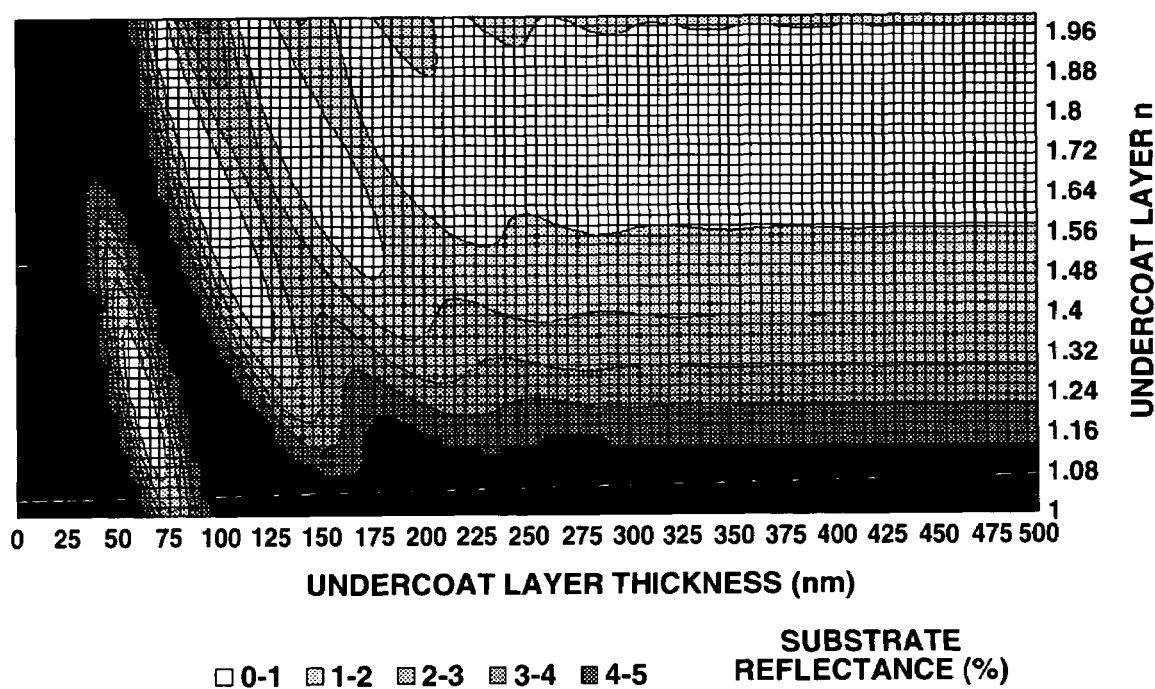
FIG. 1 is a graph plotting the substrate reflectance versus undercoat layer thickness in bilayer process when the k value of the undercoat layer is fixed at 0.3 and the n value varies from 1.0 to 2.0.
Figure 2:
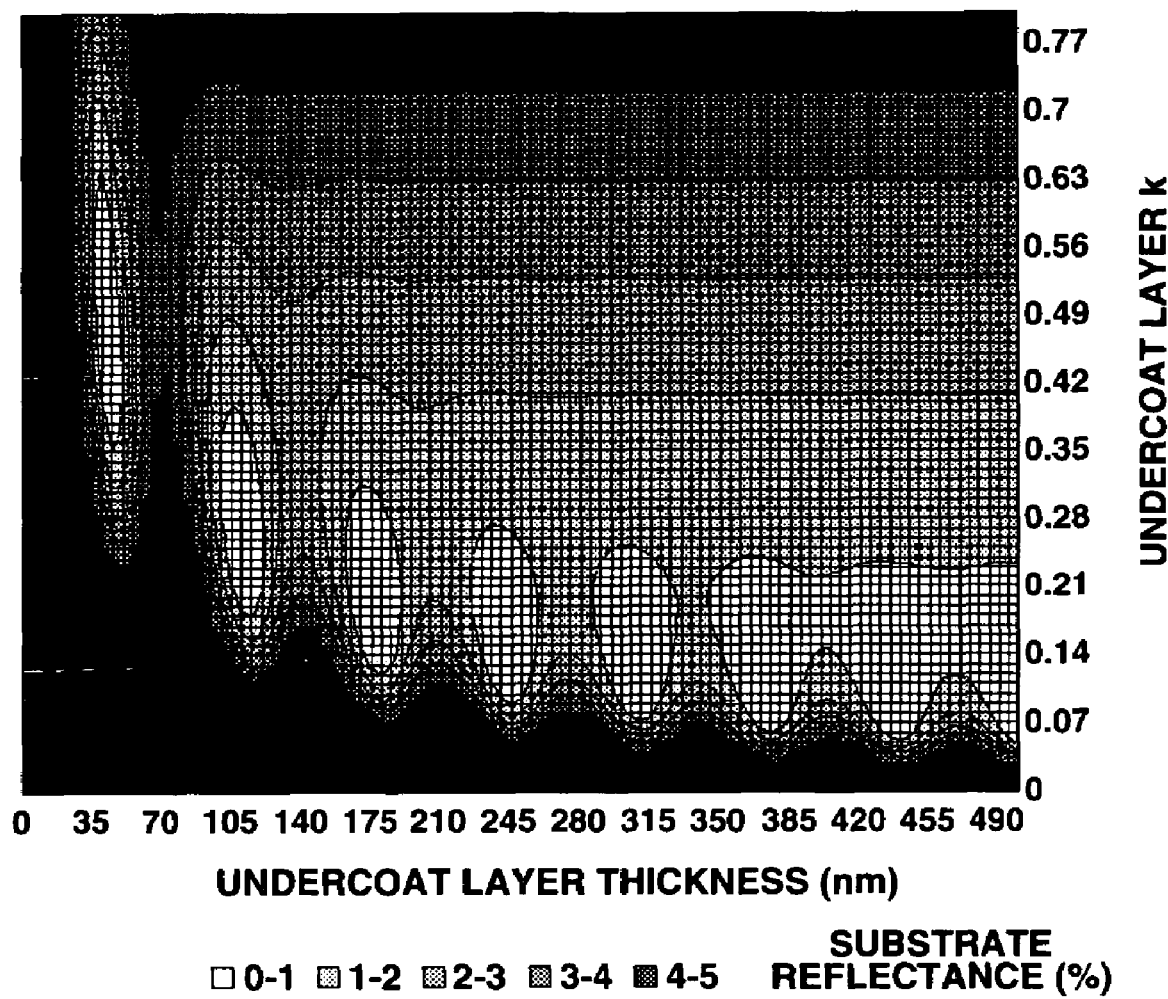
FIG. 2 is a graph plotting the substrate reflectance versus undercoat layer thickness in bilayer process when the n value of the undercoat layer is fixed at 1.5 and the k value varies from 0.1 to 1.0.
Figure 3:
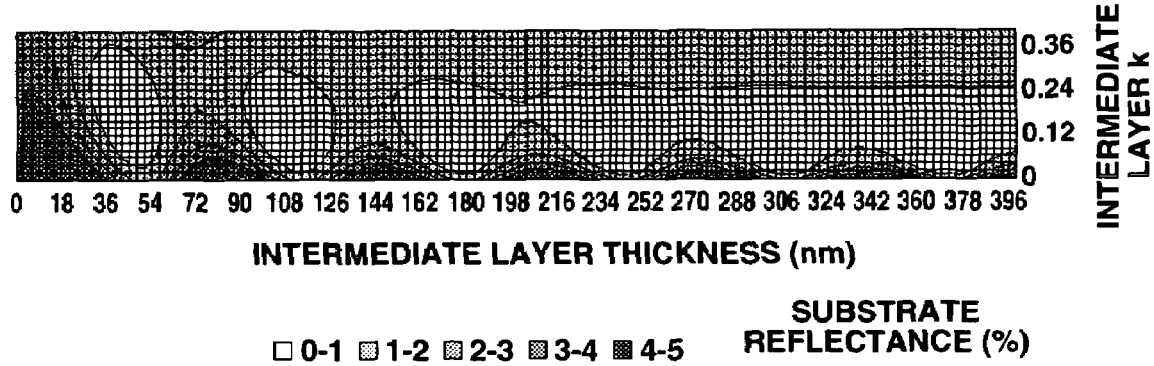
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.3 and a thickness varying from 0 to 400 nm.
Figure 4:
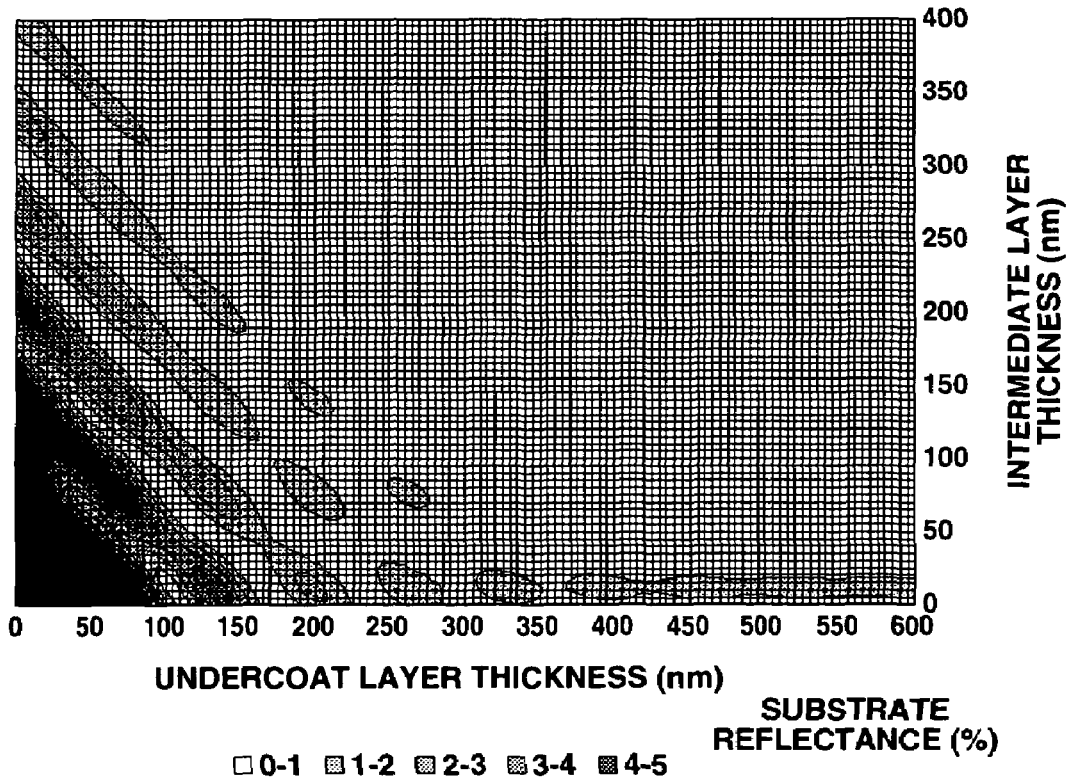
FIG. 4 is a graph plotting the substrate reflectance versus varying thickness of the undercoat layer and intermediate layer in trilayer process when the undercoat layer has a fixed n of 1.5 and a fixed k of 0.2, and the intermediate layer has a fixed n of 1.5 and a fixed k of 0.1.
Figure 5:
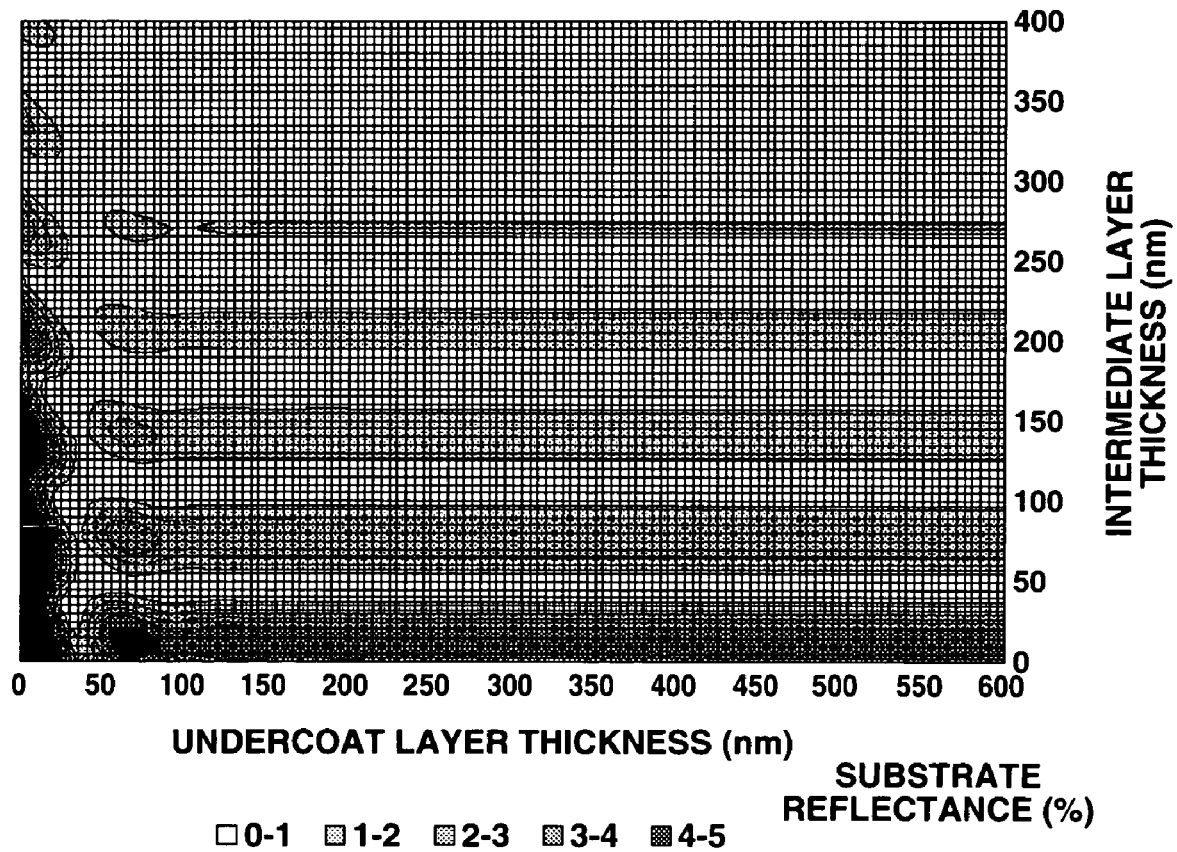
FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

The patterning process of the invention involves the steps of applying a photoresist undercoat-forming material comprising a polymer obtained through copolymerization of an indene with a compound having a hydroxyl or epoxy group and a polymerizable double bond and typically a polymer obtained through copolymerization of an indene with hydroxystyrene or glycidyl ether styrene as a base resin onto a substrate to form a photoresist undercoat layer, applying a layer of a photoresist composition over the undercoat layer, optionally with an intermediate layer interposed therebetween, exposing the photoresist layer in a predetermined region to radiation, developing the photoresist layer with a developer to form a resist pattern, and processing the undercoat layer and the substrate through the patterned photoresist layer as a mask, by means of a dry etching apparatus. The undercoat-forming material used herein comprises essentially (A) a polymer obtained by copolymerizing an indene with a compound having a hydroxyl or epoxy group and a polymerizable double bond and typically a polymer obtained by copolymerizing an indene with hydroxystyrene or glycidyl ether styrene, and optionally and preferably (B) an organic solvent, (C) a crosslinker, and (D) an acid generator.

Polymer

The polymer or high molecular weight compound used herein is a polymer obtained by copolymerizing an indene with a compound having a hydroxyl or epoxy group and a polymerizable double bond and typically a polymer obtained by copolymerizing an indene with hydroxystyrene or glycidyl ether styrene. In a preferred embodiment, recurring units derived from the indene have the general formula (a).

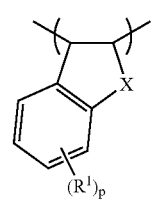

(a)

Herein $R^1$ is independently selected from the group consisting of hydrogen, straight, branched or cyclic $C_1$-$C_{10}$ alkyl groups, $C_6$-$C_{10}$ aryl groups, allyl groups, and halogen atoms, p is an integer of 1 to 4, and X is methylene, —O—, —S— or —NH—.

Suitable alkyl groups include methyl, ethyl, propyl, isopropyl, butyl, isobutyl, tert-butyl, pentyl, cyclopentyl, hexyl, cyclohexyl, octyl and decyl. Suitable aryl groups include phenyl, xylyl, tolyl and naphthyl. Suitable alkenyl groups include vinyl, allyl, propenyl, butenyl, hexenyl and cyclohexenyl. Suitable alkoxy groups include methoxy, ethoxy, propoxy, butoxy, tert-butoxy, hexyloxy and cyclohexyloxy. Suitable halogen atoms include F, Cl and Br.

Suitable monomers from which the recurring units having formula (a) are derived include indene, 4-methylindene, 5-methylindene, 6-methylindene, 7-methylindene, 4-hydroxyindene, 5-hydroxyindene, 6-hydroxyindene, 7-hydroxyindene, indole, benzofuran, and benzothiophene.

Recurring units derived from the compound having a hydroxyl or epoxy group and a polymerizable double bond are illustrated below. Among others, recurring units derived from hydroxystyrene and glycidyl ether styrene are preferred.

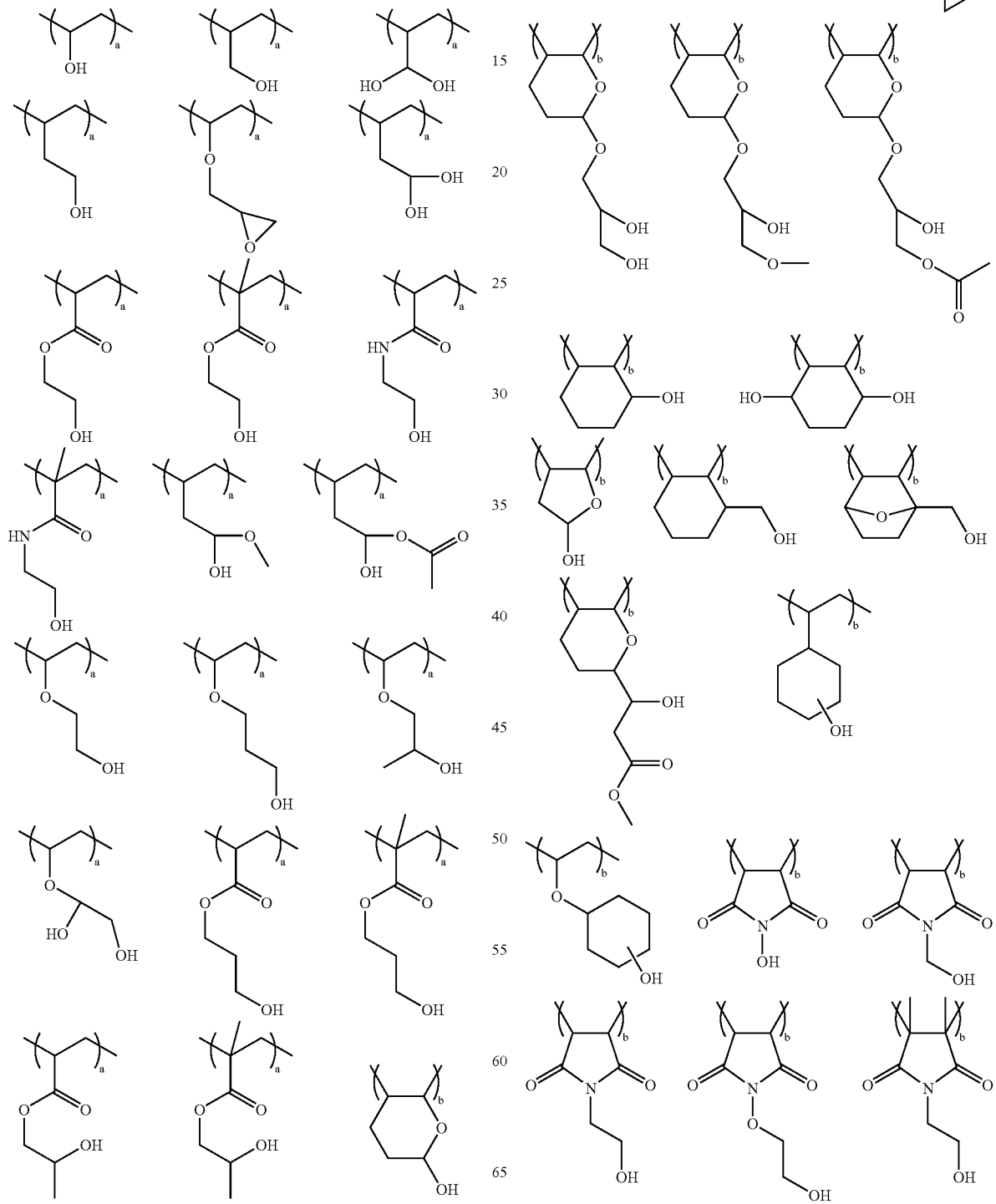

-continued
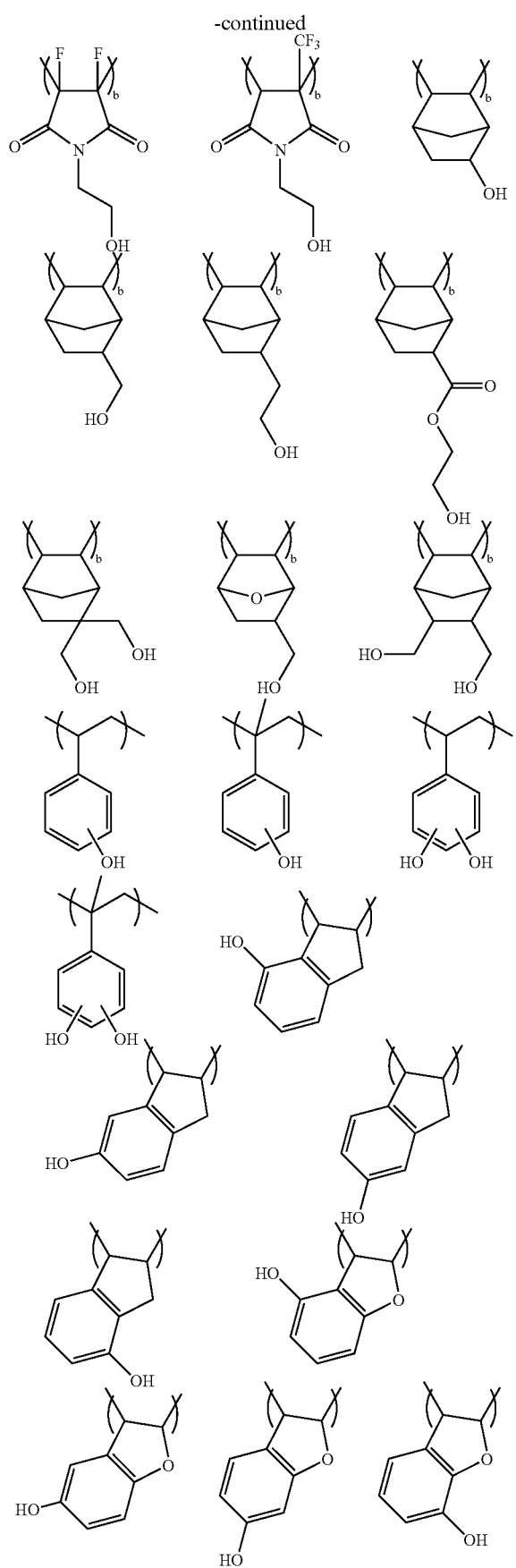
-continued
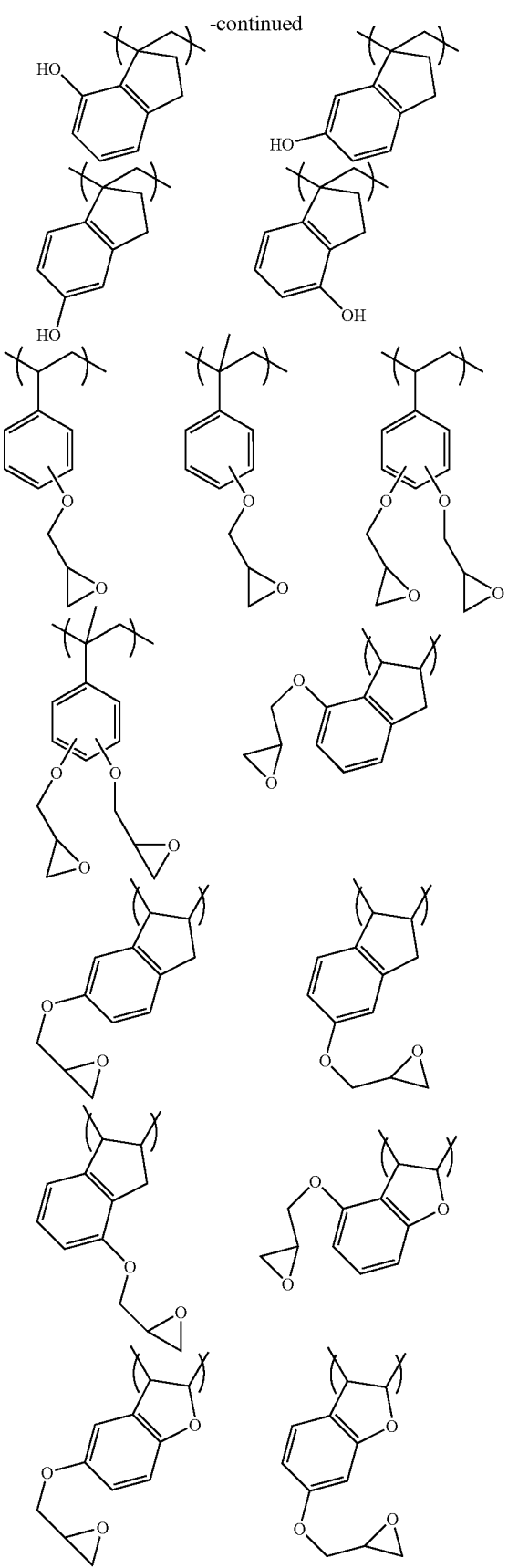

-continued

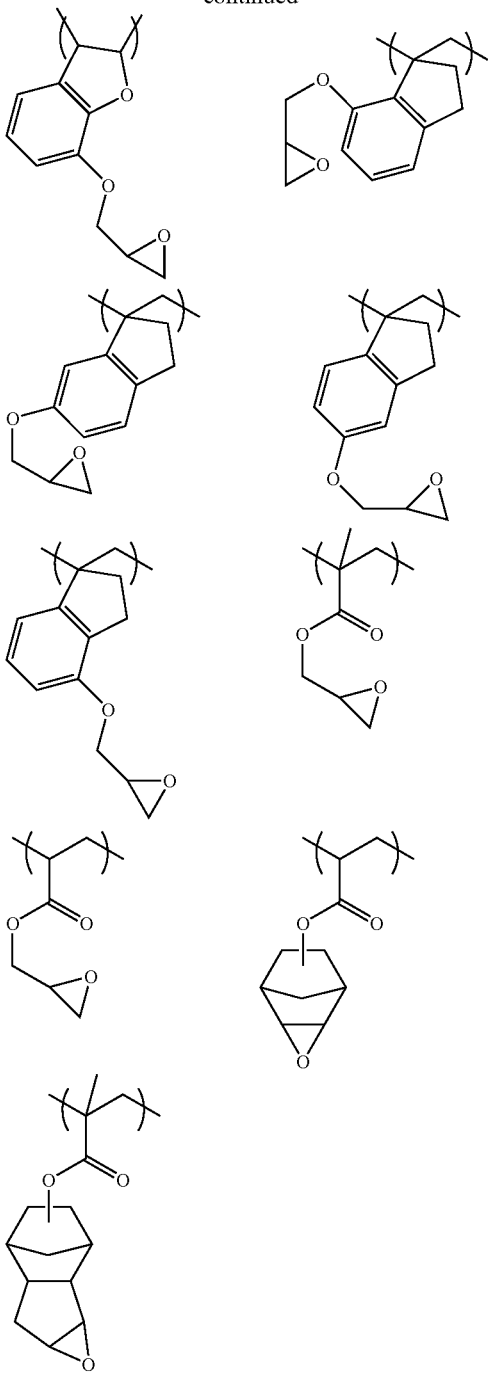

While the present invention is characterized in that a polymer obtained by copolymerizing an indene with a compound having a hydroxyl or glycidyl ether group and a polymerizable double bond is used as an undercoat layer, the polymer may further have any monomer copolymerized therewith. Suitable additional polymerizable monomers include styrene, vinylnaphthalene, vinyl anthracene, vinylpyrene, acenaphthylene, norbornene and norbornadiene.

Provided that UA stands for recurring units derived from the indene, UB stands for recurring units derived from the compound having a hydroxyl or glycidyl ether group and a polymerizable double bond, and UC stands for recurring units derived from the additional polymerizable monomer, and UA+UB+UC=C, these parameters, as expressed in molar ratio, should preferably satisfy:

$0.1 \leq UA/U \leq 0.95$, especially $0.2 \leq UA/U \leq 0.9$,
$0 \leq UB/U \leq 0.8$, especially $0.1 \leq UB/U \leq 0.7$, and
$0 \leq UC/U \leq 0.8$, especially $0 \leq UC/U \leq 0.7$.

In polymerizing the indene with the compound having a hydroxyl group and a polymerizable double bond, typically hydroxystyrene, a radical polymerization or cationic polymerization process is often employed.

Examples of radical polymerization initiators include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide.

Examples of cationic polymerization initiators include acids such as sulfuric acid, phosphoric acid, hydrochloric acid, nitric acid, hypochlorous acid, trichloroacetic acid, trifluoroacetic acid, methanesulfonic acid, trifluoromethanesulfonic acid, camphorsulfonic acid, and tosylic acid, Friedel-Crafts catalysts such as $BF_3$, $AlCl_3$, $TiCl_4$, and $SnCl_4$, and cation-generating substances such as $I_2$ and $(C_6H_5)_3CCl$.

One exemplary process for the synthesis of these polymers involves adding a cationic polymerization initiator to the indene and the compound having a hydroxyl group and a polymerizable double bond, typically hydroxystyrene to an organic solvent, and effecting heat polymerization to form a polymer. Suitable organic solvents used herein are toluene, benzene, tetrahydrofuran, diethyl ether and dioxane. The reaction mixture is preferably heated at a temperature of about 50 to 80° C. The reaction time is typically about 2 to about 100 hours, and preferably about 5 to about 20 hours.

In the case of the compound having a glycidyl ether group and a polymerizable double bond, typically glycidyl ether styrene, radical polymerization is employed because cationic polymerization can cause cleavage of the epoxy moiety. Alternatively, once the indene and the compound having a hydroxyl group and a polymerizable double bond, typically hydroxystyrene are polymerized together, the resulting polymer is reacted with epichlorohydrin for converting the hydroxyl groups to glycidyl ether groups.

The copolymers derived from an indene and compound having a hydroxyl or glycidyl ether group and a polymerizable double bond, typically hydroxystyrene or glycidyl ether styrene, should preferably have a weight average molecular weight (Mw) in the range of about 2,000 to about 30,000, more preferably about 3,000 to about 20,000, as measured by gel permeation chromatography (GPC) versus polystyrene standards. Their molecular weight distribution or dispersity (Mw/Mn) is preferably in the range of 1.0 to 3.0. A narrow dispersity which is arrived at by cutting off monomer components, oligomeric components or low molecular weight components having a Mw of not more than 1,000 offers benefits of more efficient crosslinking and reduced amounts of volatile components during baking, preventing contamination around the baking cup.

In the inventive polymer, recurring units having formula (a) can be hydrogenated to further improve its transparency at 193 nm. The degree of hydrogenation is preferably up to 80 mol %, more preferably up to 60 mol % of the aromatic groups. Although the lower limit is not critical, a degree of hydrogenation of at least 10 molt is preferred for achieving a certain transparency-improving effect.

While the base resin of the undercoat-forming material of the invention is characterized by the inclusion of the polymer obtained through copolymerization of an indene and a compound having a hydroxyl or epoxy group and a polymerizable double bond and typically the polymer obtained through copolymerization of an indene and hydroxystyrene or glycidyl ether styrene, the resin can be blended with any of conventional polymers which are used in the art as the antireflective film-forming material. For example, a copolymer of indene and hydroxystyrene with a molecular weight (Mw) of 5,000 has a glass transition temperature (Tg) of at least 150° C., and when used alone, is sometimes ineffective in filling deep holes such as via holes. One effective approach of filling holes with a resin without leaving voids is by using a polymer having a low Tg or a low molecular weight component-rich polymer, and heating the polymer at a temperature below the crosslinking temperature to provide a heat flow, thereby filling holes to the bottom (see U.S. Pat. No. 6,316,165 or JP-A 2000-294504). The inventive polymer may be blended with polymers having a low Tg, typically a Tg below 180° C., especially a Tg of 100 to 170° C., for example, novolac resins, polymers resulting from polymerization of one or more monomers selected from among styrene, hydroxystyrene, acrylic derivatives, vinyl alcohol, vinyl ethers, allyl ethers, styrene derivatives, allyl benzene derivatives, olefins such as ethylene, propylene and butadiene, and polymers obtained by metathesis ring-opening polymerization, to form blends having a lower Tg and improved via hole filling performance.

Also, the inventive polymer may be blended with another polymer for the purpose of increasing or decreasing absorbance. If it is desired to alleviate the drawback that the inventive polymer allows for increased substrate reflection because indene has a very high absorption peak at 193 nm, there may be blended naphthol resins, dicyclopentadiene resins, (meth) acrylic resins, naphthalene ring-containing resins such as vinyl naphthalene, polyacenaphthylene or aromatic ring-free resins featuring high transparency at 193 nm.

The introduction of fused aromatic or cycloaliphatic substituent groups as pendants has the benefit of lower Tg than ordinary novolac resins. The Tg can be lowered by 10 to 50° C. although such a Tg lowering depends on the type and proportion of substituent groups introduced as pendants.

Another Tg lowering method is to substitute straight, branched or cyclic $C_1$-$C_{20}$ alkyl groups (e.g., t-butyl, t-amyl), acid labile groups (e.g., acetal), acetyl or pivaloyl groups for hydrogen atoms of hydroxyl groups on hydroxystyrene-derived units. The degree of substitution is preferably in a range of 10 to 80 mol %, more preferably 15 to 70 mol % based on the hydroxyl groups.

One of the functions required for the undercoat layer including an antireflective film is the elimination of intermixing with the resist layer and the elimination of diffusion of low molecular weight components into the resist layer (see Proc. SPIE Vol. 2195, pp. 225-229 (1994)). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed.

Crosslinker

Examples of the crosslinker which can be used herein include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

For the polymers derived through copolymerization of an indene and a compound having a hydroxyl or glycidyl ether group and a polymerizable double bond and typically an indene and a compound (typically hydroxystyrene) having a hydroxyl group substituted with a glycidyl ether group, the addition of a compound having a hydroxyl group or a hydroxyl group whose hydrogen atom is substituted with a glycidyl group is effective. Compounds having at least two hydroxyl groups in a molecule are more preferred. Examples include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[$5.2.1.0^{2,6}$]-decane, pentaerythritol, 1,2,6-hexanetriol, 4,4',4''-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4''-ethylidyne tris[2-methylphenol], 4,4',4''-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4'',4'''-(1,2-ethanediylidene)tetrakisphenol, 4,4',4'',4'''-(1,2-ethanediylidene)tetrakis[2-methylphenol], 2,2'-methylenebis[6-[(2-hydroxy-5-methylphenyl)methyl]-4-methylphenol], 4,4',4'',4'''-(1,4-phenylenedimethylidyne)tetrakisphenol, 2,4,6-tris(4-hydroxyphenylmethyl)-1,3-benzenediol, 2,4',4''-methylidenetrisphenol, 4,4',4'''-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4'',4'''-tetrakis[(1-methylethylidene)bis(1,4-cyclo-hexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol]].

In the inventive undercoat-forming material, the crosslinker is preferably compounded in an amount of 5 to 50 parts by weight, more preferably 10 to 40 parts by weight per 100 parts by weight of the base polymer (entire resin). Less than 5 pbw of the crosslinker may allow for mixing with the resist. More than 50 pbw of the crosslinker may degrade the antireflection effect or allow the crosslinked film to crack.

Acid Generator

In the practice of the invention, an acid generator may be added to accelerate the thermally induced crosslinking reaction. Acid generators include those which generate an acid through pyrolysis and those which generate an acid upon exposure to light, and both are useful.

The acid generators used herein include (i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1a-3):

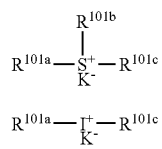

-continued

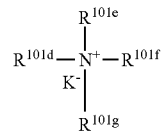

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring. $R^{101d}$, $R^{101e}$, $R^{101f}$, and $R^{101g}$, taken together, may stand for a heterocyclic aromatic ring having the nitrogen atom (in the formula) incorporated therein.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

Examples of the heterocyclic aromatic ring having the nitrogen atom (in formula (P1a-3)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photoacid generator and a thermal acid generator while the salts of (P1a-3) function as a thermal acid generator.

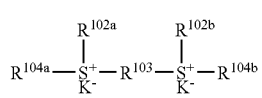

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

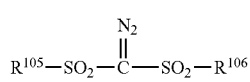

(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

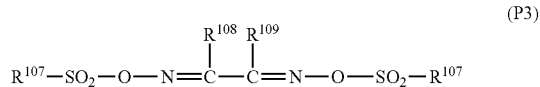

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

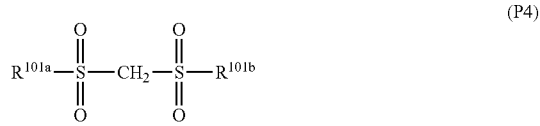

(P4)

Herein, $R^{101a}$ and $R^{101b}$ are as defined above.

(v) Sulfonic Acid Esters of N-hydroxyimide Compounds of Formula (P5)

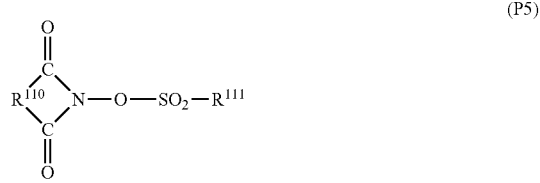

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:

onium salts such as tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethane-sulfonate, bis(p-tert-butoxyphenyl)phenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethane-sulfonate, (2-norbornyl)methyl(2-oxocyclohexyl)sulfonium trifluoro-methanesulfonate, ethylenebis[methyl(2-oxocyclopentyl)sulfonium trifluoro-methanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone derivatives and dicyclohexyl disulfone derivatives;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl) diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof. The acid generator is preferably added in an amount of 0.1 to 50 parts by weight, and especially 0.5 to 40 parts by weight, per 100 parts by weight of the base resin. Less than 0.1 pbw of the acid generator generates an insufficient amount of acid to induce crosslinking reaction whereas more than 50 pbw of the acid generator may invite a mixing phenomenon that the acid migrates into the overlaying resist.

Basic Compound

In the undercoat-forming material of the invention, a basic compound may be compounded for improving the storage stability. The basic compound plays the role of an acid quencher for preventing a small amount of acid generated from the acid generator from promoting the crosslinking reaction.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the base resin. Less than 0.001 pbw of the basic compound may fail to provide the desired effect whereas more than 2 pbw of the basic compound may trap the entirety of thermally generated acid to inhibit crosslinking reaction.

Organic Solvent

The organic solvent used in the undercoat-forming material of the invention may be any organic solvent in which the base resin, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, propylene glycol monomethyl ether acetate and propylene glycol monomethyl ether, and mixtures thereof.

The organic solvent is preferably added in an amount of about 200 to 10,000 parts by weight, especially about 300 to 5,000 parts by weight per 100 parts by weight of the base resin.

Like photoresists, the undercoat-forming material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from mixing with the overlaying resist. The baking is preferably effected at a temperature of 80 to 300° C. for a time of 10 to 300 seconds. The thickness of the undercoat layer may be suitably determined although it is preferably in the range of 30 to 20,000 nm, especially 50 to 15,000 nm.

Once the undercoat layer is formed, a silicon-containing resist layer is formed thereon in the case of bilayer process, and a silicon-containing intermediate layer is formed thereon and a silicon-free monolayer resist layer is formed on the intermediate layer in the case of tri-layer process. Any of well-known photoresist compositions may be used to form the resist layer.

As the silicon-containing resist composition for the bilayer process, a positive photoresist composition comprising a silicon atom-containing polymer such as a polysilsesquioxane derivative or vinylsilane derivative as a base polymer, an organic solvent, a photoacid generator, and optionally, a basic compound or the like is often used from the standpoint of oxygen gas etching resistance. As the silicon atom-containing polymer, any of well-known polymers which are used in resist compositions of this type may be used.

As the silicon-containing intermediate layer for the tri-layer process, an intermediate layer based on polysilsesquioxane is preferably used. The intermediate layer having the function of an antireflective coating is effective for restraining reflection.

Especially for 193-nm exposure, while the use of a material containing more aromatic groups and having high resistance to substrate etching as the undercoat layer provides a high k value and high substrate reflection, the combined use of an intermediate layer that restrains reflection is successful in reducing the substrate reflection to 0.5% or less. As the intermediate layer having an antireflective effect, use is preferably made of anthracene for 248 and 157-nm exposure and polysilsesquioxane having phenyl groups or photo-absorbing groups having a silicon-to-silicon bond as pendants and capable of acid- or heat-assisted crosslinking for 193-nm exposure.

Also, an intermediate layer formed by chemical vapor deposition (CVD) may be used. Know intermediate layers formed by CVD and having the increased function of an antireflective coating are SiON coatings. As compared with the CVD, formation of an intermediate layer by a spin coating technique is simple and economical. The topcoat resist in the tri-layer process may be either positive or negative and may be the same as a commonly used monolayer resist.

The undercoat layer of the inventive material can also serve as an antireflective film for usual monolayer resists. Since the undercoat layer of the inventive material is highly resistant to etching for processing of the underlying member, it is also expected to have a function of hard mask during underlying member processing.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a liquid developer, obtaining a resist pattern. The thickness of the resist layer is preferably in a range of 30 to 500 nm, more preferably 50 to 400 nm, though not critical. The radiation for exposure may be selected from among high-energy radiation having a wavelength of up to 300 nm, specifically excimer laser beams of 248 nm, 193 nm and 157 nm, soft X-rays of 3 to 20 nm, electron beams, and X-rays.

Next, etching is carried out using the resist pattern as a mask. In the bilayer process, the undercoat layer is typically etched with oxygen gas. In addition to oxygen gas, an inert gas such as He or Ar or another gas such as CO, $CO_2$, $NH_3$, $SO_2$, $N_2$, $NO_2$ or $H_2$ may be added to the etching gas. The other gas is used for sidewall protection, that is, for preventing the pattern sidewalls from being undercut. Etching solely with CO, $CO_2$, $NH_3$, $N_2$, $NO_2$ or $H_2$ gas without using oxygen gas is also acceptable. In the tri-layer process, the intermediate layer is etched with a fluorocarbon-base gas using the patterned resist as a mask. Then the undercoat layer is etched with oxygen gas (same as above) using the patterned intermediate layer as a mask.

Next, the processable substrate is etched by a conventional technique. For example, when the substrate is $SiO_2$ or SiN, etching with a fluorocarbon-base gas is employed. When the substrate is p-Si, Al or W, etching with a chlorine or bromine-base gas is employed. When the substrate processing is etching with a fluorocarbon-base gas, the silicon-containing resist in the bilayer resist process and the silicon-containing intermediate layer in the tri-layer process are stripped at the same time as the substrate processing. When the substrate is etched with a chlorine or bromine-base gas, the silicon-containing resist or the silicon-containing intermediate layer must be subsequently stripped by dry etching with a fluorocarbon-base gas after the substrate processing.

The undercoat layer of the invention is resistant to the etching of the substrate with any of such gases.

The processable substrate is formed on a support substrate. The support substrate includes those of Si, α-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, α-Si, W, W—Si, Al, Cu, Al—Si and the like and stop films thereof, and typically has a thickness of 50 to 10,000 nm, especially 100 to 5,000 nm.

Now referring to FIGS. 6 and 7, the bilayer resist working process and trilayer resist working process are illustrated.

Figure 6A:
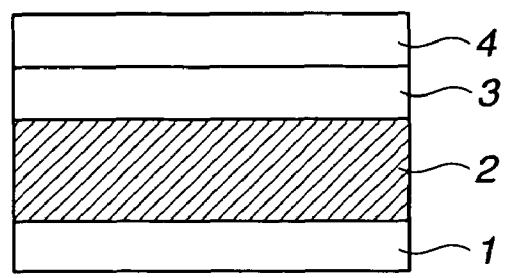
FIG. 6 illustrates steps of a bilayer resist working process.
Figure 6B:
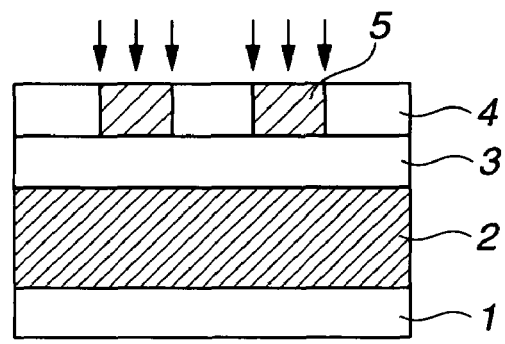
Figure 6C:
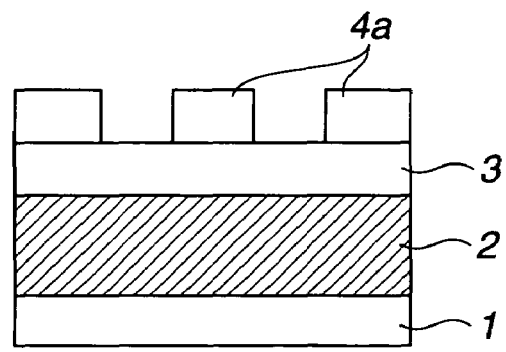
Figure 6D:
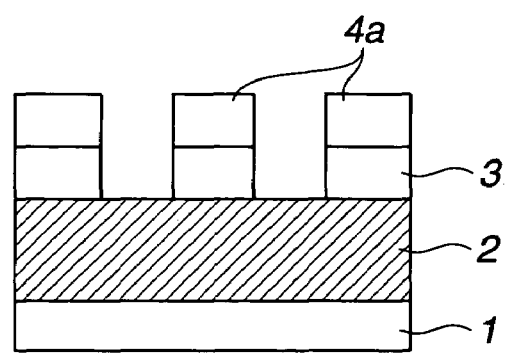
Figure 6E:
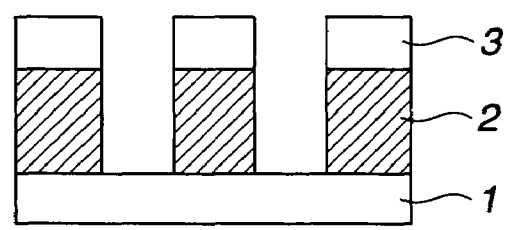

In the bilayer resist working process, as shown in FIG. 6A, an undercoat-forming material is applied onto a processable substrate (or film) 2 lying on a support substrate 1 to form an undercoat layer 3. A photoresist composition, especially a photoresist composition comprising a silicon atom-containing polymer as a base resin is then applied onto the undercoat layer 3 to form a photoresist layer 4. Through a photomask (not shown), a predetermined region 5 of the photoresist layer 4 is exposed to light as shown in FIG. 6B. By subsequent PEB and development, a patterned photoresist layer 4a is formed as shown in FIG. 6C. Thereafter, as shown in FIG. 6D, the undercoat layer 3 is etched with an oxygen plasma using the patterned photoresist layer 4a as a mask. The patterned photoresist layer 4a is removed, after which the processable substrate 2 is processed by etching as shown in FIG. 6E.

Figure 7A:
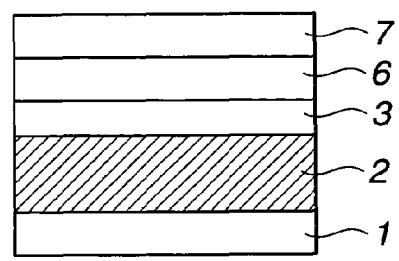
FIG. 7 illustrates steps of a trilayer resist working process.
Figure 7B:
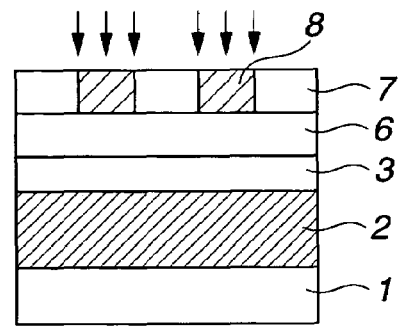
Figure 7C:
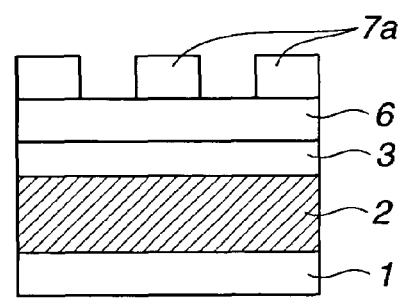
Figure 7D:
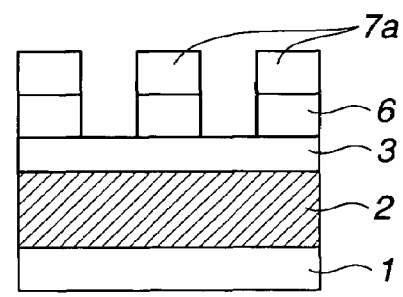
Figure 7E:
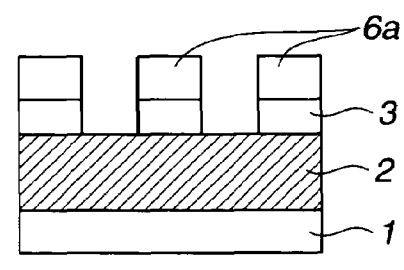
Figure 7F:
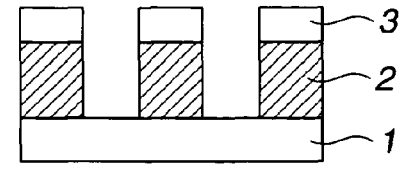

In the trilayer resist working process, as shown in FIG. 7A, an undercoat-forming material is applied onto a processable substrate (or film) 2 lying on a support substrate 1 to form an undercoat layer 3, in the same manner as in the bilayer resist process. A silicon-containing intermediate layer 6 is then formed on the undercoat layer 3, and a single layer photoresist layer 7 is formed on the intermediate layer 6. Next, as shown in FIG. 7B, a predetermined region 8 of the photoresist layer 7 is exposed to light. By subsequent PEB and development, a patterned photoresist layer 7a is formed as shown in FIG. 7C. Using the patterned photoresist layer 7a as a mask, the intermediate layer 6 is etched with a fluorocarbon (CF) base gas as shown in FIG. 7D. The patterned photoresist layer 7a is removed, after which the undercoat layer 3 is etched with an oxygen plasma using the patterned intermediate layer 6a as a mask as shown in FIG. 7E. Finally, the patterned intermediate layer 6a is removed, after which the processable substrate 2 is processed by etching as shown in FIG. 7F.

EXAMPLE

Synthesis Examples and Examples are given below together with Comparative Examples for further illustrating the invention although the invention is not limited thereby.

It is noted that a molecular weight is measured by the following procedure. A polymer is analyzed by gel permeation chromatography (GPC) using polystyrene standards, for determining a weight average molecular weight (Mw) and a number average molecular weight (Mn), from which a dispersity (Mw/Mn) is computed.

Synthesis Example 1

A 2-L flask was charged with 81 g of indene, 36 g of 4-hydroxystyrene, and 80 g of 1,2-dichloroethane as a solvent. In a nitrogen atmosphere, 1 g of boron trifluoride as a polymerization initiator was added to the reactor, which was heated at 60° C. whereupon reaction took place for 15 hours. The reaction solution was concentrated to one half in volume, and poured into a mixture of 2.5 L methanol and 0.2 L water for precipitation. The resulting white solids were collected by filtration and dried in vacuo at 60° C., leaving 35 g of a white polymer, designated Polymer 1.

The molecular weight (Mw) and dispersity (Mw/Mn) of Polymer 1 were determined by GPC. From $^1$H-NMR analysis, the ratio of monomer units in the polymer was determined.

Polymer 1:
indene/4-hydroxystyrene molar ratio=0.71:0.29
Mw=8,600
Mw/Mn=1.89

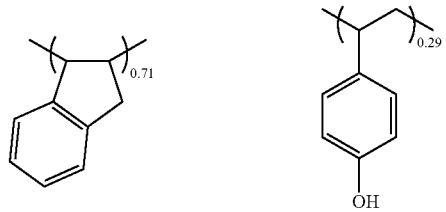

Polymer 1

Synthesis Example 2

A 2-L flask was charged with 55 g of indene, 66 g of 4-hydroxyindene, and 80 g of 1,2-dichloroethane as a solvent. In a nitrogen atmosphere, 1 g of boron trifluoride as a polymerization initiator was added to the reactor, which was heated at 60° C. whereupon reaction took place for 15 hours. The reaction solution was concentrated to one half in volume, and poured into a mixture of 2.5 L methanol and 0.2 L water for precipitation. The resulting white solids were collected by filtration and dried in vacuo at 60° C., leaving 35 g of a white polymer, designated Polymer 2.

The molecular weight (Mw) and dispersity (Mw/Mn) of Polymer 2 were determined by GPC. From $^1$H-NMR analysis, the ratio of monomer units in the polymer was determined.

Polymer 2:
indene/4-hydroxyindene molar ratio=0.48:0.52
Mw=6,500
Mw/Mn=1.55

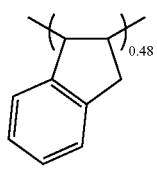 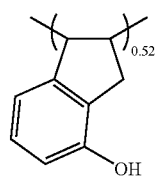

Polymer 2

Synthesis Example 3

A 2-L flask was charged with 56.8 g of glycidyl methacrylate, 48.0 g of 4-hydroxystyrene, 25.5 g of indene, and 150 g of tetrahydrofuran as a solvent. The reactor was cooled to −70° C. in a nitrogen atmosphere whereupon vacuum evacuation and nitrogen flow were repeated three times. The reactor was warmed to room temperature, fed with 2.6 g of AIBN as a polymerization initiator, and heated at 60° C. whereupon reaction took place for 15 hours. The reaction solution was poured into 1,500 mL of isopropyl alcohol for precipitation. The resulting white solids were collected by filtration and dried in vacuo at 60° C., leaving 110.1 g of a white polymer, designated Polymer 3.

Polymer 3 was analyzed by $^{13}$C-NMR, $^{1}$H-NMR and GPC, with the results shown below.

Polymer 3:
copolymerization composition (molar ratio),
glycidyl methacrylate/4-hydroxystyrene/indene=0.42:0.38:0.20
Mw=8,400
Mw/Mn=1.83

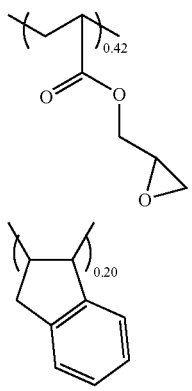 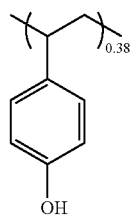

Polymer 3

Synthesis Example 4

A 200-mL flask was charged with 11.5 g of indene, 14.1 g of N-hydroxyethylmaleimide, and 15 g of tetrahydrofuran as a solvent. The reactor was cooled to −70° C. in a nitrogen atmosphere whereupon vacuum evacuation and nitrogen flow were repeated three times. The reactor was warmed to room temperature, fed with 2.5 g of 2,2'-azobis(2,4-dimethyl-valeronitrile) as a polymerization initiator, and heated at 55° C. whereupon reaction took place for 25 hours. The reaction solution was diluted with 5 mL of acetone and poured into 2 L of isopropyl alcohol for precipitation. The resulting white solids were collected by filtration and dried in vacuo at 40° C., leaving 13 g of a white polymer, designated Polymer 4.

Polymer 4 was analyzed by $^{13}$C-NMR, $^{1}$H-NMR and GPC, with the results shown below.

Polymer 4:
copolymerization composition (molar ratio),
indene/N-hydroxyethylmaleimide=0.50:0.50
Mw=6,500
Mw/Mn=1.66

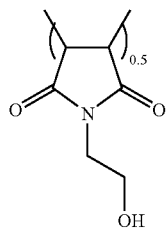 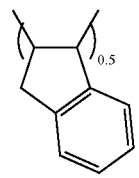

Polymer 4

Examples and Comparative Examples

An undercoat layer-coating solution and an intermediate layer-coating solution were prepared by dissolving a polymer (Polymers 1 to 4 or comparative polymers listed in Table 1) or a silicon-containing polymer for intermediate layer and an acid generator (AG1, AG2), and a crosslinker (CR1) in a solvent containing 0.1 wt % of Fluorad FC-430 (3M-Sumitomo Co., Ltd.) according to the formulation shown in Table 1, and passing through a fluoroplastic filter having a pore size of 0.1 μm.

The undercoat-forming material solution and the intermediate layer-coating solution were separately applied onto a silicon substrate and baked at 200° C. for 60 seconds to form a polymer layer of 300 nm thick (designated UDL1-6, UDL9 and Comparative UDL1-3) as the undercoat layer or baked at 300° C. for 60 seconds to form a polymer layer of 300 nm thick (designated UDL7-8) as the undercoat layer and a silicon-containing layer of 100 nm thick (designated SOG1) as the intermediate layer. Using a variable angle spectroscopic ellipsometer (VASE®) of J. A. Woollam Co., the refractive index (n, k) at wavelength 193 nm of UDL1 to UDL9, SOG1 and Comparative UDL1 to UDL3 was determined. The results are also shown in Table 1.

TABLE 1

| No. | Polymer (pbw) | Crosslinker (pbw) | Acid generator (pbw) | Solvent (pbw) | Refractive index (193 nm) | |
|---|---|---|---|---|---|---|
| | | | | | n | k |
| UDL1 | Polymer 1 (28.0) | CR1 (5) | AG1 (1) | PGMEA (100) | 1.39 | 0.96 |
| UDL2 | Polymer 2 (28.0) | CR1 (5) | AG1 (1) | PGMEA (100) | 1.33 | 0.80 |

TABLE 1-continued

| No. | Polymer (pbw) | Crosslinker (pbw) | Acid generator (pbw) | Solvent (pbw) | Refractive index (193 nm) n | k |
|---|---|---|---|---|---|---|
| UDL3 | Polymer 1 (28.0) | CR1 (5) | AG2 (1) | PGMEA (100) | 1.33 | 0.93 |
| UDL4 | Polymer 1 (28.0) | CR1 (5) | AG2 (1) | PGMEA (100) | 1.38 | 0.92 |
| UDL5 | Polymer 3 (28.0) | — | AG2 (1) | PGMEA (100) | 1.40 | 0.55 |
| UDL6 | Polymer 4 (28.0) | CR1 (5) | AG2 (1) | PGMEA (100) | 1.52 | 0.38 |
| UDL7 | Polymer 1 (28.0) | — | — | PGMEA (100) | 1.38 | 0.88 |
| UDL8 | Polymer 2 (28.0) | — | — | PGMEA (100) | 1.35 | 0.77 |
| UDL9 | Polymer 1 (15.0) Polymer blend 1 (15) | CR1 (5) | AG1 (1) | PGMEA (100) | 1.65 | 0.45 |
| SOG1 | ArF Si-containing intermediate layer polymer 1 (20) | — | AG2 (1) | PGMEA (100) | 1.53 | 0.15 |
| Comparative UDL1 | Comparative Polymer 1 (28.0) | — | AG1 (1) | PGMEA (100) | 1.45 | 0.22 |
| Comparative UDL2 | m-cresol novolak (28.0) | CR1 (10) | AG1 (1) | PGMEA (100) | 1.28 | 0.62 |
| Comparative UDL3 | poly-p-hydroxystyrene (28.0) | CR1 (10) | AG1 (1) | PGMEA (100) | 1.62 | 0.58 |

ArF Si-containing intermediate layer polymer 1:

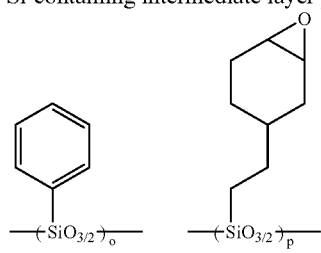

(o = 0.20, p = 0.50, q = 0.30  Mw = 3,400)

Comparative Polymer 1:
 poly-p-hydroxystyrene/1-adamantyl methacrylate molar ratio=0.32:0.68
 Mw=10,800
 Mw/Mn=1.82
m-cresol novolac resin:
 Mw=8,800
 Mw/Mn=4.5
Poly-p-hydroxystyrene:
 Mw=9,200
 Mw/Mn=1.05
Polymer blend 1:
 1-naphthol/dicyclopentadiene molar ratio=0.70:0.30 (novolac)
 Mw=1,200
 Mw/Mn=3.8

CR1

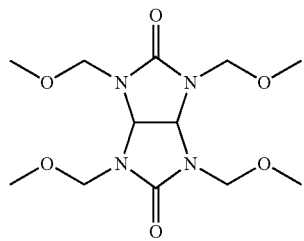

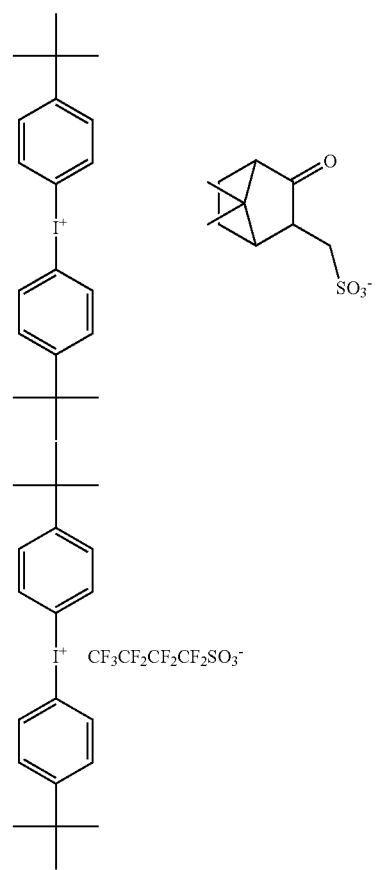

AG1

AG2

PGMEA: propylene glycol monomethyl ether acetate

A topcoat resist solution (ArF single layer resist) was prepared by dissolving a resin, an acid generator, and a basic compound in a solvent containing 0.1 wt% of FC-430 (3M-Sumitomo Co., Ltd.) according to the formulation shown in Table 2, and passing through a fluoroplastic filter having a pore size of 0.1 μm.

TABLE 2

| No. | Polymer (pbw) | Acid generator | Base (pbw) | Solvent (pbw) |
|---|---|---|---|---|
| SL resist for ArF | ArF SL resist polymer 1 (100) | PAG1 (2.2) | TMMEA (0.3) | PGMEA (1200) |

ArF single layer resist polymer 1:

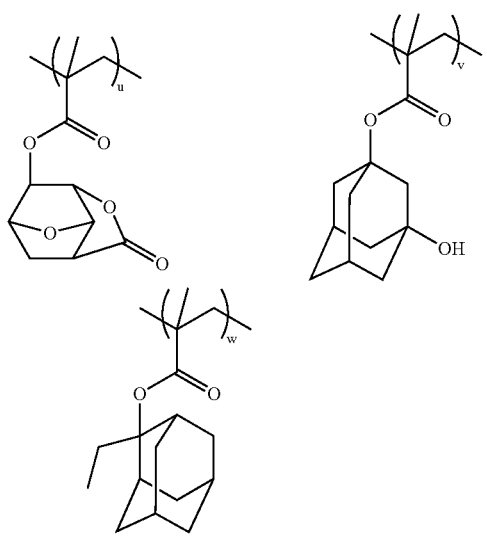

(u = 0.40, v = 0.30, w = 0.30  Mw = 7,800)

TMMEA

PAG1

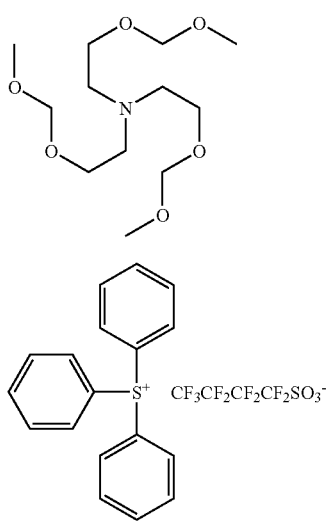

Next, the undercoat-forming material solution (UDL1-6, UDL9, Comparative UDL1-3) was applied onto a SiO$_2$ substrate of 300 nm thick and baked at 200° C. for 60 seconds to form an undercoat layer of 300 nm thick. In the case of undercoat-forming materials UDL7 and 8, they were baked at 300° C. for 60 seconds to form an undercoat layer of 300 nm thick.

The silicon-containing intermediate layer-forming material solution SOG1 was applied thereon and baked at 200° C. for 60 seconds to form an intermediate layer of 100 nm thick. Then the ArF exposure single layer resist solution was applied and baked at 130° C. for 60 seconds to form a photoresist layer of 200 nm thick.

Thereafter, the resist layer was exposed using an ArF laser stepper S305B (Nikon Corporation, NA 0.68, σ0.85, 2/3 annular illumination, Cr mask), then baked (PEB) at 110° C. for 60 seconds, and developed for 60 seconds with a 2.38 wt % aqueous solution of tetramethylammonium hydroxide (TMAH), thereby giving a positive pattern. The profile of the 0.12 μm line-and-space pattern was observed. The results are shown in Table 5.

Finally, dry etching tests were conducted. There were prepared undercoat layers (UDL1-9, Comparative UDL1-3) as used for the measurement of refractive index. These undercoat layers were examined by a test (1) of etching with $CF_4$/$CHF_3$ gas using a dry etching instrument TE-8500P by Tokyo Electron K.K. A difference in thickness of the undercoat layer or resist before and after the etching test was determined, from which an etching rate per minute was computed. The results are shown in Table 3.

| (1) $CF_4$/$CHF_3$ gas etching test | |
|---|---|
| Chamber pressure | 40.0 Pa |
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

TABLE 3

| Antireflective film, resist No. | $CF_4$/$CHF_3$ gas etching rate (nm/min) |
|---|---|
| UDL1 | 72 |
| UDL2 | 68 |
| UDL3 | 71 |
| UDL4 | 67 |
| UDL5 | 92 |
| UDL6 | 82 |
| UDL7 | 68 |
| UDL8 | 62 |
| UDL9 | 70 |
| Comparative UDL1 | 144 |
| Comparative UDL2 | 120 |
| Comparative UDL3 | 129 |

The undercoat layers (UDL1-9, Comparative UDL1-3) were further examined by a test (2) of etching with $Cl_2$/$BCl_3$ gas using a dry etching instrument L-507D-L by Nichiden Anerba K.K. A difference in thickness of the polymer layer before and after the etching test was determined, from which an etching rate was computed. The results are shown in Table 4.

| (2) $Cl_2$/$BCl_3$ gas etching test | |
|---|---|
| Chamber pressure | 40.0 Pa |
| RF power | 300 W |

| (2) Cl$_2$/BCl$_3$ gas etching test | |
| --- | --- |
| Gap | 9 mm |
| Cl$_2$ gas flow rate | 30 ml/min |
| BCl$_3$ gas flow rate | 30 ml/min |
| CHF$_3$ gas flow rate | 100 ml/min |
| O$_2$ gas flow rate | 2 ml/min |
| Time | 60 sec |

TABLE 4

| Antireflective film, resist No. | Cl$_2$/BCl$_3$ gas etching rate (nm/min) |
| --- | --- |
| UDL1 | 80 |
| UDL2 | 72 |
| UDL3 | 81 |
| UDL4 | 71 |
| UDL5 | 103 |
| UDL6 | 92 |
| UDL7 | 75 |
| UDL8 | 69 |
| UDL9 | 62 |
| Comparative UDL1 | 166 |
| Comparative UDL2 | 132 |
| Comparative UDL3 | 140 |

Then, the resist pattern resulting from the ArF exposure and development was transferred to the SOG film by etching. The etching conditions (3) are given below.

| (3) Transfer to SOG by etching | |
| --- | --- |
| Chamber pressure | 40.0 Pa |
| RF power | 1000 W |
| Gap | 9 mm |
| CHF$_3$ gas flow rate | 20 ml/min |
| CF$_4$ gas flow rate | 60 ml/min |
| Ar gas flow rate | 200 ml/min |
| Time | 30 sec |

Next, the pattern transferred to the SOG film was further transferred to the undercoat layer by etching with oxygen-base gas. The etching conditions (4) are given below.

| (4) Transfer to undercoat by etching | |
| --- | --- |
| Chamber pressure | 60.0 Pa |
| RF power | 600 W |
| Gap | 9 mm |
| Ar gas flow rate | 40 ml/min |
| O$_2$ gas flow rate | 60 ml/min |
| Time | 20 sec |

Finally, using the patterned undercoat layer as a mask, the SiO$_2$ substrate was processed under the etching conditions (1).

A cross section of the pattern was observed under an electron microscope S-4700 (Hitachi, Ltd.). The pattern profile was compared in this way, with the results shown in Table 5.

TABLE 5

| No. | Topcoat resist | Pattern profile after development | SOG profile after transfer etching | Undercoat profile after transfer etching | Substrate profile after transfer etching |
| --- | --- | --- | --- | --- | --- |
| UDL1 | SL resist for ArF | perpendicular | perpendicular | perpendicular | perpendicular |
| UDL2 | SL resist for ArF | perpendicular | perpendicular | perpendicular | perpendicular |
| UDL3 | SL resist for ArF | perpendicular | perpendicular | perpendicular | perpendicular |
| UDL4 | SL resist for ArF | perpendicular | perpendicular | perpendicular | perpendicular |
| UDL5 | SL resist for ArF | perpendicular | perpendicular | perpendicular | perpendicular |
| UDL6 | SL resist for ArF | perpendicular | perpendicular | perpendicular | perpendicular |
| UDL7 | SL resist for ArF | perpendicular | perpendicular | perpendicular | perpendicular |
| UDL8 | SL resist for ArF | perpendicular | perpendicular | perpendicular | perpendicular |
| UDL9 | SL resist for ArF | perpendicular | perpendicular | perpendicular | perpendicular |
| Comparative UDL1 | SL resist for ArF | perpendicular | perpendicular | perpendicular | tapered and slimmed |
| Comparative UDL2 | SL resist for ArF | perpendicular | perpendicular | perpendicular | tapered |
| Comparative UDL3 | SL resist for ArF | perpendicular | perpendicular | perpendicular | tapered |

Separately, the undercoat-forming material solution (UDL1-2, Comparative UDL1-3) was applied onto a Si$_3$N$_4$ substrate of 100 nm thick and baked at 200° C. for 60 seconds to form an undercoat layer of 80 nm thick. The ArF exposure single-layer resist solution was applied thereon and baked at 130° C. for 60 seconds to form a photoresist layer of 200 nm thick.

Thereafter, the resist layer was exposed using an ArF laser stepper S305B (Nikon Corporation, NA 0.68, σ0.85, 2/3 annular illumination, Cr mask), then baked (PEB) at 110° C. for 60 seconds, and developed for 60 seconds with a 2.38 wt % aqueous solution of TMAH, thereby giving a positive pattern. The profile of the 0.12 μm line-and-space pattern was observed.

The resist pattern resulting from the ArF exposure and development was transferred to the undercoat layer by etching. The etching conditions (5) are given below.

| (5) Transfer to undercoat by etching | |
|---|---|
| Chamber pressure | 40.0 Pa |
| RF power | 600 W |
| Gap | 9 mm |
| CHF$_3$ gas flow rate | 20 ml/min |
| CF$_4$ gas flow rate | 60 ml/min |
| O$_2$ gas flow rate | 7 ml/min |
| Ar gas flow rate | 200 ml/min |
| Time | 15 sec |

Then, the pattern transferred to the undercoat layer was transferred to the underlying oxide film by etching. The etching conditions (6) are given below.

| (6) Transfer to substrate by etching | |
|---|---|
| Chamber pressure | 40.0 Pa |
| RF power | 1000 W |
| Gap | 9 mm |
| CHF$_3$ gas flow rate | 60 ml/min |
| CF$_4$ gas flow rate | 20 ml/min |
| Ar gas flow rate | 200 ml/min |
| Time | 20 sec |

A cross section of the pattern was observed under an electron microscope S-4700 (Hitachi, Ltd.). The pattern profile was compared in this way, with the results shown in Table 6.

It is seen from Tables 3 and 4 that when etched with CF$_4$/CHF$_3$ gas and Cl$_2$/BCl$_3$ gas, the undercoat layers within the scope of the invention exhibit significantly slower etching rates than the ordinary novolac resin and polyhydroxystyrene. As seen from Table 5, when the undercoat material is applied to the trilayer resist processing, the profile of resist after development, and the profile of undercoat layer after oxygen etching and after substrate processing by etching are satisfactory. As seen from Table 6, when the undercoat material is used as a single layer resist hard mask, the profiles are satisfactory both after development and after substrate processing by etching.

Japanese Patent Application No. 2004-208385 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An undercoat-forming material comprising a polymer obtained by copolymerizing an indene with a compound having a hydroxyl or epoxy group and a polymerizable double bond.

2. An undercoat-forming material comprising a polymer obtained by copolymerizing an indene with hydroxystyrene or glycidyl ether styrene.

3. The material of claim 1, wherein recurring units derived from the indene have the general formula (a):

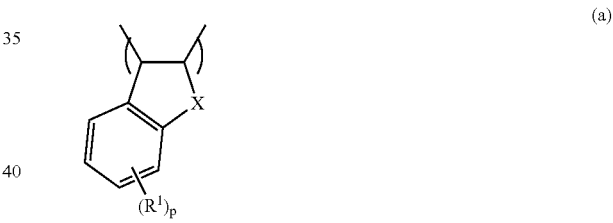

wherein R$^1$ is independently selected from the group consisting of hydrogen, straight, branched or cyclic C$_1$-C$_{10}$ alkyl groups, C$_6$-C$_{10}$ aryl groups, allyl groups, and halogen atoms, p is an integer of 1 to 4, and X is methylene, —O—, —S— or —NH—.

TABLE 6

| No. | Topcoat resist | Pattern profile after development | Undercoat profile after transfer etching | Substrate profile after transfer etching |
|---|---|---|---|---|
| UDL1 | SL resist for ArF | perpendicular | perpendicular | perpendicular |
| UDL2 | SL resist for ArF | perpendicular | perpendicular | perpendicular |
| Comparative UDL1 | SL resist for ArF | corrugated pattern sidewall due to standing waves from substrate reflection | tapered and pattern collapsed | tapered and slimmed |
| Comparative UDL2 | SL resist for ArF | perpendicular | perpendicular | tapered |
| Comparative UDL3 | SL resist for ArF | perpendicular | perpendicular | tapered |

4. The material of claim 1, further comprising an organic solvent and an acid generator.

5. The material of claim 1, further comprising a crosslinker.

6. A patterning process comprising the steps of:
applying the undercoat-forming material of claim 1 onto a processable substrate to form an undercoat layer,
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

7. The patterning process of claim 6, wherein said photoresist composition comprises a hydrocarbon compound, and the processing step includes dry etching the undercoat layer through the photoresist layer as a mask.

8. The patterning process of claim 6, wherein said photoresist composition comprises a silicon atom-containing polymer, and the processing step includes dry etching the undercoat layer through the photoresist layer as a mask with an oxygen-based etching gas.

9. A patterning process comprising the steps of:
applying the undercoat-forming material of claim 1 onto a processable substrate to form an undercoat layer,
applying a silicon atom-containing intermediate layer over the undercoat layer,
applying a photoresist composition onto the intermediate layer to form a photoresist layer,
exposing the photoresist layer in a predetermined region to radiation,
developing the photoresist layer with a developer to form a photoresist pattern,
processing the intermediate layer through the patterned photoresist layer as a mask,
removing the patterned photoresist layer, and
processing the undercoat layer and then the substrate through the processed intermediate layer as a mask,
the processing steps using a dry etching apparatus.

10. The patterning process of claim 9, wherein said photoresist composition comprises a silicon atom-free polymer, and the step of processing the undercoat layer includes dry etching with an oxygen-based etching gas.

11. The material of claim 1, wherein the compound having a hydroxyl or epoxy group and a polymerizable double bond gives at least one recurring unit selected from the group consisting of recurring units having the following formulae:

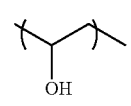 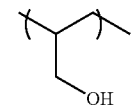 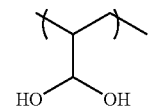

 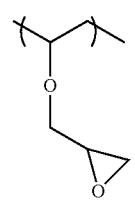 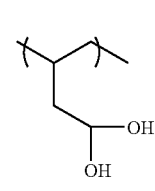

-continued

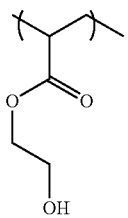 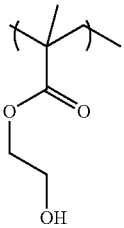 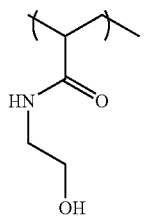

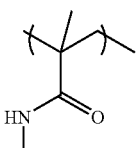 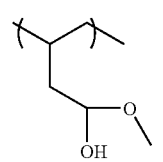 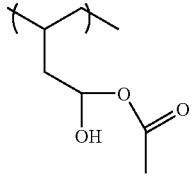

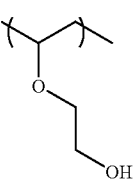 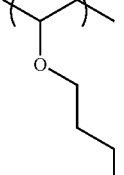 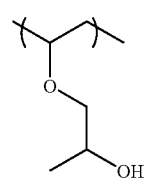

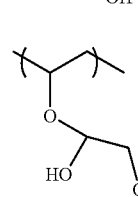 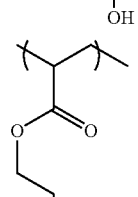 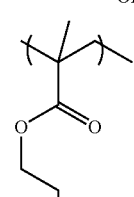

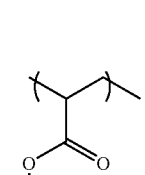 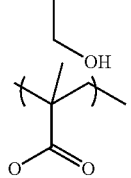 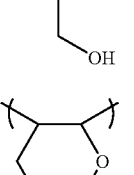

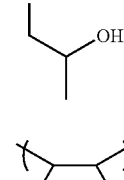 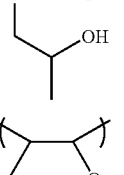 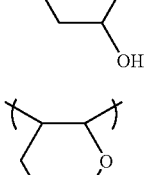

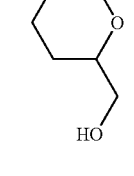 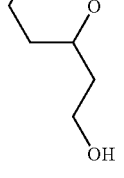 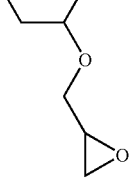

-continued
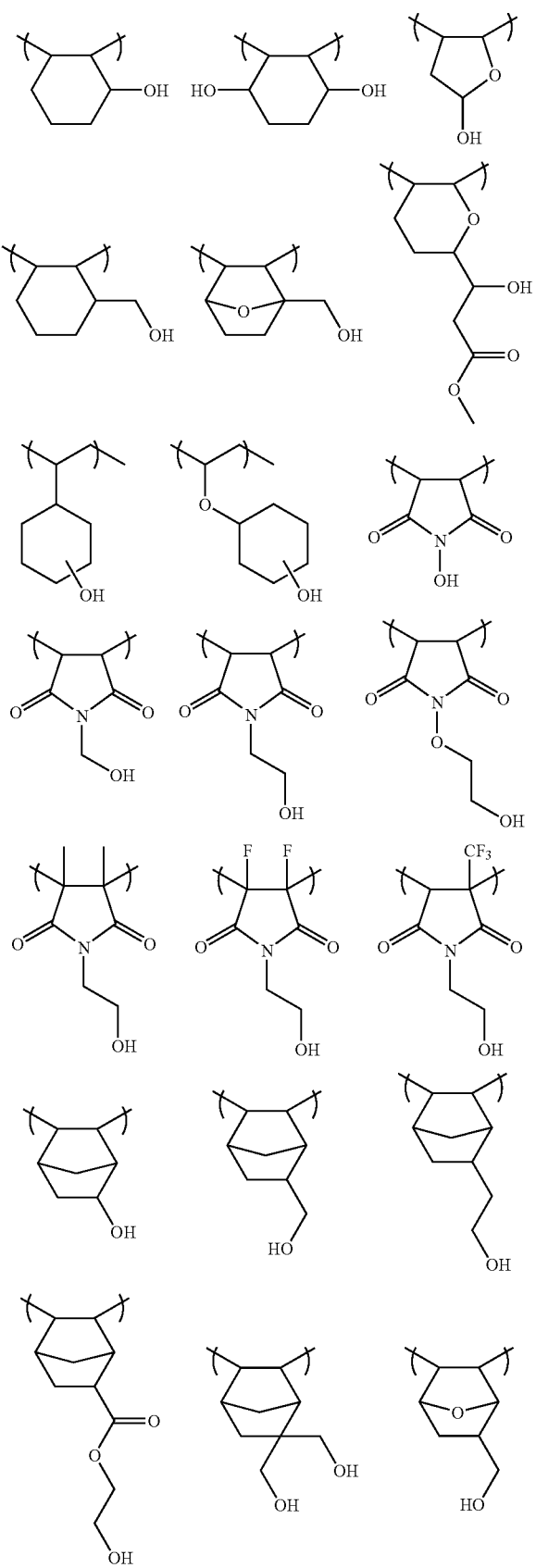
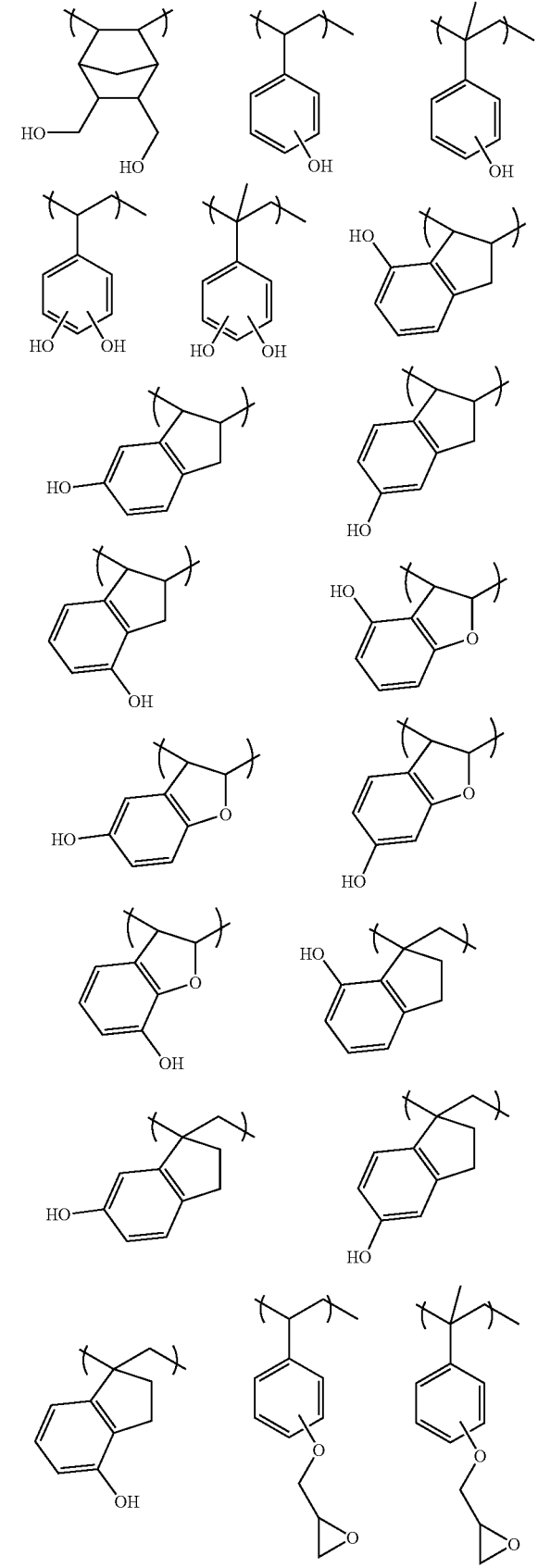

-continued

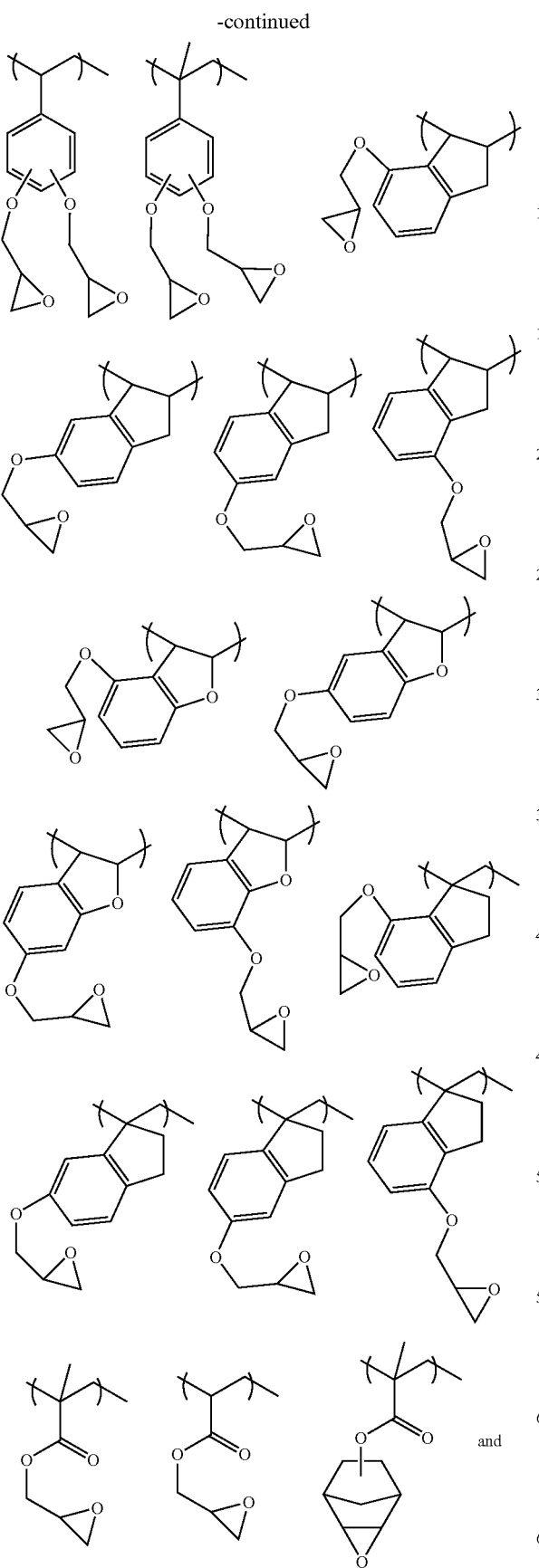

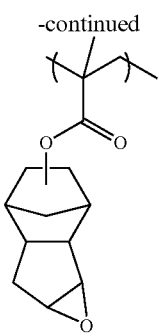

12. The material of claim 2, wherein recurring units derived from the indene have the general formula (a):

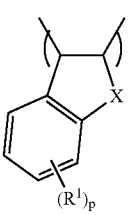

(a)

wherein $R^1$ is independently selected from the group consisting of hydrogen, straight, branched or cyclic $C_1$-$C_{10}$ alkyl groups, $C_6$-$C_{10}$ aryl groups, allyl groups, and halogen atoms, p is an integer of 1 to 4, and X is methylene, —O—, —S— or —NH—.

13. The material of claim 2, further comprising an organic solvent and an acid generator.

14. The material of claim 2, further comprising a crosslinker.

15. A patterning process comprising the steps of:
applying the undercoat-forming material of claim 2 onto a processable substrate to form an undercoat layer,
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

16. The patterning process of claim 14, wherein said photoresist composition comprises a hydrocarbon compound, and the processing step includes dry etching the undercoat layer through the photoresist layer as a mask.

17. The patterning process of claim 14, wherein said photoresist composition comprises a silicon atom-containing polymer, and the processing step includes dry etching the undercoat layer through the photoresist layer as a mask with an oxygen-based etching gas.

18. A patterning process comprising the steps of:
applying the undercoat-forming material of claim 2 onto a processable substrate to form an undercoat layer,
applying a silicon atom-containing intermediate layer over the undercoat layer,
applying a photoresist composition onto the intermediate layer to form a photoresist layer,
exposing the photoresist layer in a predetermined region to radiation, developing the photoresist layer with a developer to form a photoresist pattern,
processing the intermediate layer through the patterned photoresist layer as a mask,
removing the patterned photoresist layer, and
processing the undercoat layer and then the substrate through the processed intermediate layer as a mask,
the processing steps using a dry etching apparatus.

19. The patterning process of claim 18, wherein said photoresist composition comprises a silicon atom-free polymer, and the step of processing the undercoat layer includes dry etching with an oxygen-based etching gas.

* * * * *